(12) United States Patent
Watanabe

(10) Patent No.: US 6,940,024 B2
(45) Date of Patent: Sep. 6, 2005

(54) PRINTED WIRING BOARD HAVING WIRING PATTERNS AND CONNECTION TERMINALS

(75) Inventor: Yasushi Watanabe, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 355 days.

(21) Appl. No.: 10/195,223

(22) Filed: Jul. 15, 2002

(65) Prior Publication Data

US 2003/0015349 A1 Jan. 23, 2003

(30) Foreign Application Priority Data

Jul. 19, 2001 (JP) ........................................ 2001-219365

(51) Int. Cl.[7] ............................ H05K 1/11; H01R 12/04
(52) U.S. Cl. ........................ 174/261; 174/256; 174/267
(58) Field of Search ................................ 174/254, 256, 174/255, 260, 257, 261, 250; 361/749, 750, 751, 760; 29/825, 829, 84; 439/67, 79, 80, 81

(56) References Cited

U.S. PATENT DOCUMENTS

| | | | | | |
|---|---|---|---|---|---|
| 4,774,634 A | * | 9/1988 | Tate et al. | ................... | 361/760 |
| 4,815,981 A | * | 3/1989 | Mizuno | ........................ | 439/77 |
| 4,830,779 A | * | 5/1989 | Maeno et al. | ................ | 252/512 |
| 4,859,808 A | * | 8/1989 | Jeter et al. | .................... | 174/261 |
| 5,042,971 A | * | 8/1991 | Ambrose | ...................... | 439/77 |
| 5,045,141 A | * | 9/1991 | Salensky et al. | ............ | 156/240 |
| 5,174,925 A | | 12/1992 | Fujii et al. | | |
| 6,016,598 A | * | 1/2000 | Middelman et al. | .......... | 29/830 |
| 6,108,210 A | * | 8/2000 | Chung | ........................ | 361/747 |
| 6,278,618 B1 | * | 8/2001 | Lee et al. | .................... | 361/820 |

FOREIGN PATENT DOCUMENTS

JP         101962/1998        4/1998

* cited by examiner

Primary Examiner—Kamand Cuneo
Assistant Examiner—Ishwar (I. B.) Patel
(74) Attorney, Agent, or Firm—Brinks Hofer Gilson & Lione

(57) ABSTRACT

Wiring patterns are made of a conductive material containing Ag particles that exhibit high conductivity. Connection terminals that are connected to the ends of part of the wiring patterns, respectively, are made of a conductive material containing conductive particles in each of which an Au coating layer is formed on the surface of a conductive core particle. The connection terminals are arranged parallel with each other at small intervals on a narrow insertion portion of a flexible insulative board without being covered with respective conductive coatings.

11 Claims, 6 Drawing Sheets

PRINTED WIRING BOARD HAVING WIRING PATTERNS AND CONNECTION TERMINALS

This application claims the benefit of priority to Japanese Patent Application 2001-219365 filed on Jul. 19, 2001.

BACKGROUND OF THE INVENTION

1. Field of the Invention

The present invention relates to a printed wiring board used in, for example, an operating panel of an electronic apparatus and particularly to a printed wiring board that can be used in a small electronic apparatus.

2. Description of the Related Art

FIG. 8 shows a conventional printed wiring board. A conductor pattern P1 is formed on a flexible insulative board 51. The conductor pattern P1 consists of a plurality of filed contact units 54, a plurality of wiring patterns 55 that extend so as to be in electrical contact with the fixed contact units 54, and connection terminals 56 for electrical connection between an external apparatus and the fixed contact units 54 and the wiring patterns 55. The connection terminals 56 are formed on an end portion 51c of the flexible insulative board 51 so as to be arranged parallel with each other.

The conductor pattern P1 is made of a conductive material in which Ag (silver) particles are dispersed in polyester resin. The Ag particles have a role of rendering the conductor pattern P1 conductive. Although the conductor pattern P1 has high conductivity because of the Ag particles that exhibit high conductivity, the Ag particles may cause a migration phenomenon in a high-humidity atmosphere.

To prevent a migration phenomenon by shielding the conductor pattern P1 from humidity, the wiring patterns 55 of the conductor pattern P1 is covered with a resist film 57 that is made of an insulative material such as poly(vinyl chloride) and the fixed contact units 54 and the connection terminals 56 are covered with conductive coatings 59 in which carbon power is dispersed in binder resin.

The conductor pattern P1 is formed by forming, by screen printing, patterns of conductive ink in which Ag powder is dispersed in organic solvent containing polyester resin and then volatilizing the organic solvent by drying the conductive ink.

The conductive coatings 59 covering the fixed contact units 54 and the connection terminals 56 are formed in the following manner. After the formation of the conductor pattern P1, patterns of conductive ink in which carbon particles are dispersed in organic solvent containing binder resin are formed by screen printing while being positioned so as to coextend with the patterns of the fixed contact units 54 and the connection terminals 56, respectively. Then, the conductive ink is dried to volatilize the organic solvent.

Movable contacts (not shown) are attached to the flexible insulative board 51 so as to able to come into electrical contact with the respective fixed contact units 54. The end portion 51c of the flexible insulative board 51, on which the connection terminals 56 are arranged parallel with each other, is inserted into the insertion mouth of a connector member that is incorporated in an electronic apparatus, whereby the conductive coatings 59 on the respective connection terminals 56 are brought into electrical contact with conductor portions that are provided inside the insertion mouth of the connector member. As a result, the conductor pattern P1 is electrically connected to other members of the electronic apparatus.

In recent years, connector members have been miniaturized as the size of electronic equipment has been decreased. As connector members are miniaturized, their insertion mouths are made narrower. Therefore, it is necessary to decrease a width dimension w1 of the end portion 51c of the flexible insulative board 51 that is to be inserted into the insertion mouth. To form the connection terminals 56 on the narrowed end portion 51c of the flexible insulative board 51, it is necessary that the connection terminals 56 be arranged parallel at smaller intervals.

However, the conventional method in which the connection terminals 56 are covered with the respective conductive coatings 59 to prevent a migration phenomenon in the connection terminals 56 has the following problems. In the manufacturing step of forming patterns of conductive coatings 59 so that they coextend with the patterns of the connection terminals 56, respectively, even a slight deviation of the pattern of a conductive coating 59 from the pattern of the associated connection terminal 56 may cause the conductive coating 59 to contact another, adjacent connection terminal 56 to short-circuit the two connection terminals 56. Therefore, the positioning of the patterns of the conductive coatings 59 with respect to the respective patterns of the connection terminals 56 is required to have higher accuracy, which results in a problem that the positioning work becomes more complicated.

SUMMARY OF THE INVENTION

An object of the present invention is therefore to more easily provide a printed wiring board that can accommodate miniaturization of electronic equipment and is not prone to a migration phenomenon.

A printed wiring board according to the invention comprises an insulative board; a plurality of wiring patterns formed on the insulative board; and a plurality of connection terminals that are arranged parallel with each other on the insulative board and are connected to at least part of the wiring patterns, respectively, wherein the connection terminals are made of a conductive material in which conductive particles each being formed by forming an Au (gold) coating layer on a surface of a conductive core particle are dispersed in a first binder resin; and wherein the wiring patterns are made of a conductive material in which Ag (silver) particles are dispersed in a second binder resin.

With this printed wiring board, an insertion portion bearing the parallel-arranged connection terminals is inserted into the insertion mouth of a connector member that is incorporated in an electronic apparatus, whereby the connection terminals are brought into contact with conductor portions that are provided inside the insertion mouth of the connector member. As such, the connection terminals play a role of causing the wiring patterns to come into electrical contact with other members of the electronic apparatus via the conductor portions of the connector member.

In the conductive material of the connection terminals, the conductive particles in each of which an Au coating layer is formed on the surface of a conductive core particle play a role of a conductive filler that renders the conductive material conductive and the first binder resin plays a role of binding those conductive particles together.

The conductive material that is rendered conductive by the conductive particles in each of which an Au coating layer is formed on the surface of a conductive core particle are superior in corrosion resistance and anti-migration characteristic because the Au coating layer has both of a function of preventing corrosion (oxidation) of the conductive core particle and a function of preventing migration.

The connection terminals made of such a conductive material do not impair its conductivity and need not be provided with migration-preventive conductive coatings. With the connection terminals that need not be provided with migration-preventive conductive coatings, a step of forming conductive coatings can be omitted and the connection terminals are not short-circuited by conductive coatings. Therefore, a narrow insertion portion on which the connection terminals are arranged parallel with each other at small intervals can be inserted into the narrow mouth of a small connector member. That is, the printed wiring board which can be used in a small electronic apparatus can be manufactured by a simple process.

The conductive core particle used in the connection terminals may be an Ni (nickel) particle. Because of good adhesiveness between the Ni particle and the Au coating layer, the surface of the Ni core particle can be coated with the Au coating layer reliably.

The conductive core particle used in the connection terminals may be a conductive particle other than an Ni particle, in which case an Ni coating layer is formed on the surface of the conductive core particle and an Au coating layer is formed on the Ni coating layer. If a Cu (copper) particle is used as the conductive core particle other than an Ni particle, the resistance of the connection terminals can be kept small because of relatively low resistivity of the Cu particle.

Where the conductive material of the connection terminals have, as the main component of the conductive filler, conductive particles in each of which an Au coating layer is formed on the surface of a conductive core particle, the conductive material may contain carbon or the like as long as it does not impair the high conductivity and the anti-migration characteristic of the conductive material that are given by the conductive particles.

As for the conductive material of the wiring patterns, the Ag particles play a role of a conductive filler that renders the conductive material conductive and the second binder resin plays a role of binding together the components such as the Ag particles.

The wiring patterns made of such a conductive material have high conductivity because of the use of the Ag particles that are good conductors, power consumption and heat generation that are caused by currents flowing through the wiring patterns can be suppressed.

Where the conductive material of the wiring patterns have Ag particles as the main component of the conductive filler, the conductive material may contain carbon or the like as long as it does not impair the high conductivity of the conductive material that is given by the Ag particles.

By using different conductive materials for the connection terminals and the wiring patterns in the above-described manner, a narrow insertion portion on which the connection terminals having a superior anti-migration characteristic are arranged parallel with each other at small intervals without being covered with respective conductive coatings can be inserted into a narrow insertion mouth of a small connector member while high conductivity of the wiring patterns is maintained.

The insulative board may be flexible, in which case the printed wiring board according to the invention can be housed in a small electronic apparatus by deforming the insulative board so as to conform to a space it is allowed to occupy.

The connection terminals may be harder than the wiring patterns. In this case, since the connection terminals are hard, the connection terminals are hardly scraped or deformed even when pushed by conductor portions (metal contacts) of a connector member. Therefore, the electrical connection between the connection terminals and the conductor portions of the connector member can be made reliable and stable.

On the other hand, being softer than the connection terminals, the wiring patterns can easily be integrated with the insulative board that is flexible and hence does not impair the flexibility of the printed wiring board.

The first binder resin may be a thermosetting resin. In this case, even if the connection terminals are pushed by conductor portions of a connector member in a high-temperature atmosphere, the connection terminals are not prone to deformation. Therefore, the electrical connection between the connection terminals and the conductor portions of the connector member can be made reliable and stable.

The printed wiring board according to the invention may be such that the insulative board is made of polyester resin film, the first binder resin is a phenol resin or an epoxy resin, and the second binder resin is a polyester resin.

Where the second binder resin of the wiring patterns is a polyester resin like the insulative board is, good adhesiveness is obtained between the wiring patterns and the insulative board. Where the first binder resin of the connection terminals is a phenol resin or an epoxy resin, the connection terminals are superior in heat resistance and corrosion resistance.

The printed wiring board according to the invention may further comprise contact patterns that are formed on the insulative board and are electrically connected to the wiring patterns, and the contact patterns may be made of the same material as the connection terminals or the wiring patterns are.

In this printed wiring board, the contact patterns can be formed by printing at the same time as the connection terminals or the wiring patterns. Therefore, the number of manufacturing steps can be reduced.

The wiring patterns may be covered with a protective film made of an insulative material. This makes it possible to prevent a migration phenomenon from occurring in the wiring patterns by shielding the wiring patterns from an external environment such as humidity.

DESCRIPTION OF THE PREFERRED EMBODIMENTS

Figure 1:
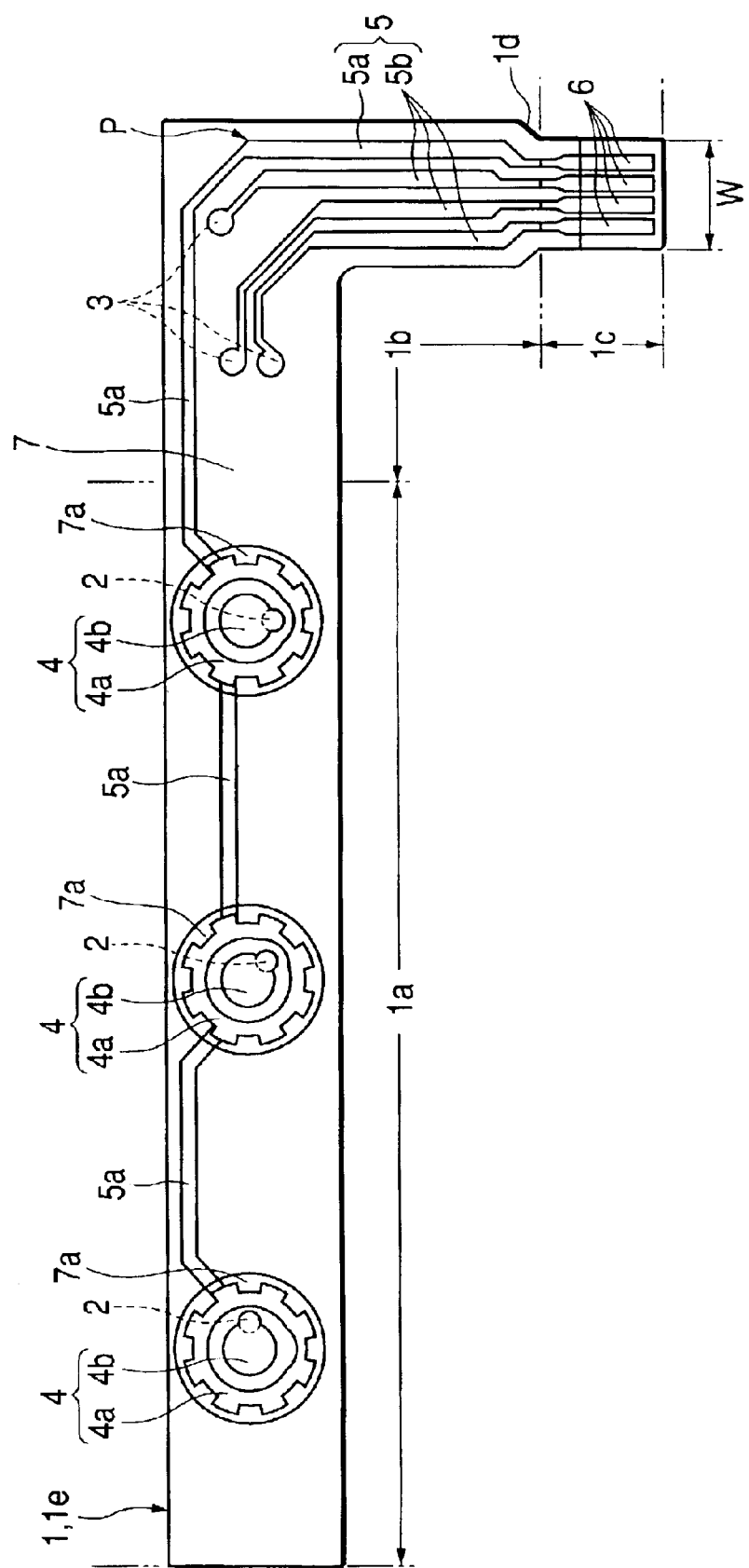
FIG. 1 is a plan view of one side of a printed wiring board according to an embodiment of the invention.
Figure 2:
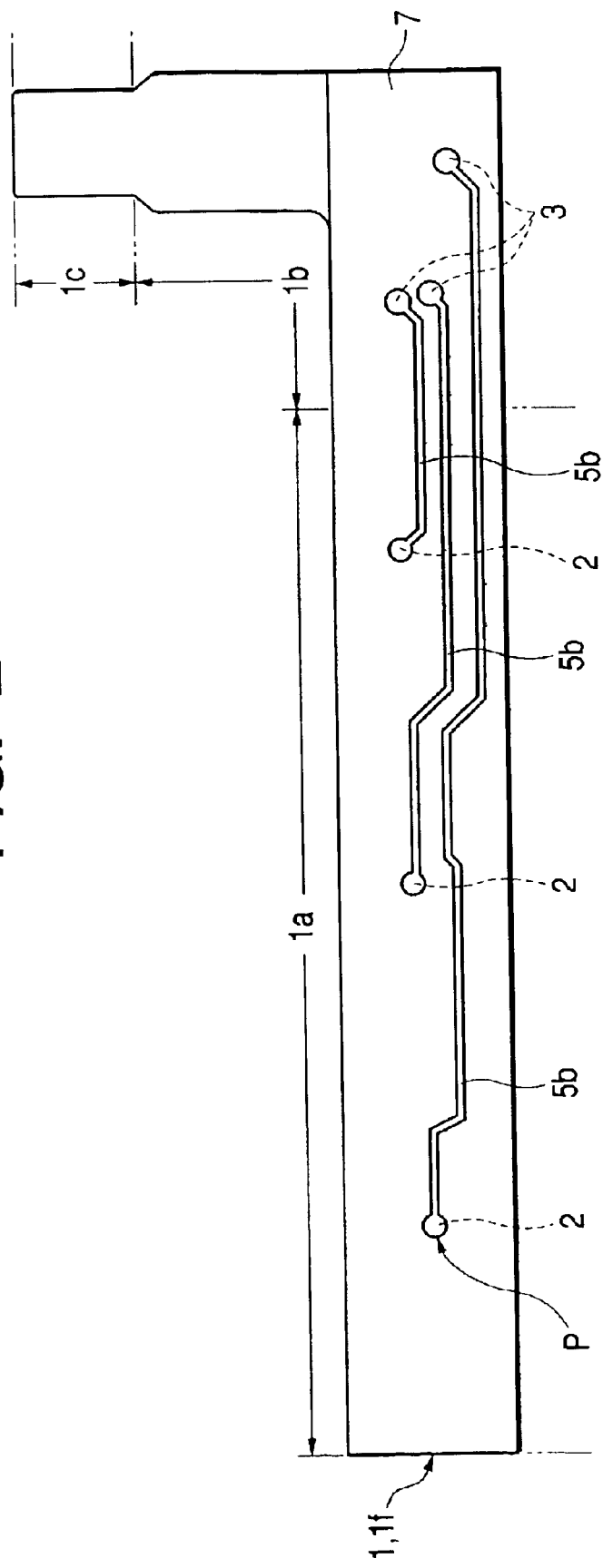
FIG. 2 is a plan view of the other side of the printed wiring board of FIG. 1.

FIGS. 1 and 2 show a printed wiring board according to an embodiment of the present invention that is for use in, for example, an operating panel of a small electronic apparatus. As shown in FIGS. 1 and 2, a conductive pattern P is formed on one surface 1e and the other surface if of an insulative board 1 that is flexible (hereinafter referred to as "flexible insulative board"). FIG. 1 is a plan view of the side, having the surface 1e, of the printed wiring board and FIG. 2 is a plan view of the side, having the surface 1f, of the printed wiring board.

The flexible insulative board 1 is made of polyester film and is composed of a rectangular contact portion 1a, a lead portion 1b that extends perpendicularly from the contact portion 1a, and an insertion portion 1c that projects from the lead portion 1b and serves as an end portion of the flexible insulative board 1. The insertion portion 1c is to be inserted into the insertion mouth of a connector member (not shown). The lead portion 1b has, on the insertion portion 2c side, a narrowing portion id that narrows toward the insertion portion 1c. The insertion portion 1c assumes a rectangular shape and has a constant width that is equal to a minimum width W of the narrowing portion 1d.

The contact portion 1a of the flexible insulative board 1 is provided with first through-holes 2 at positions corresponding to respective push buttons that are supported by the frame of an operating panel so as to be able to go up and down. The lead portion 1b of the flexible insulative board 1 is provided with second through-holes 3 in the same number as the first through-holes 2. The inside of each of the first through-holes 2 and the second through-holes 3 is filled with silver paste (not shown).

Figure 4:
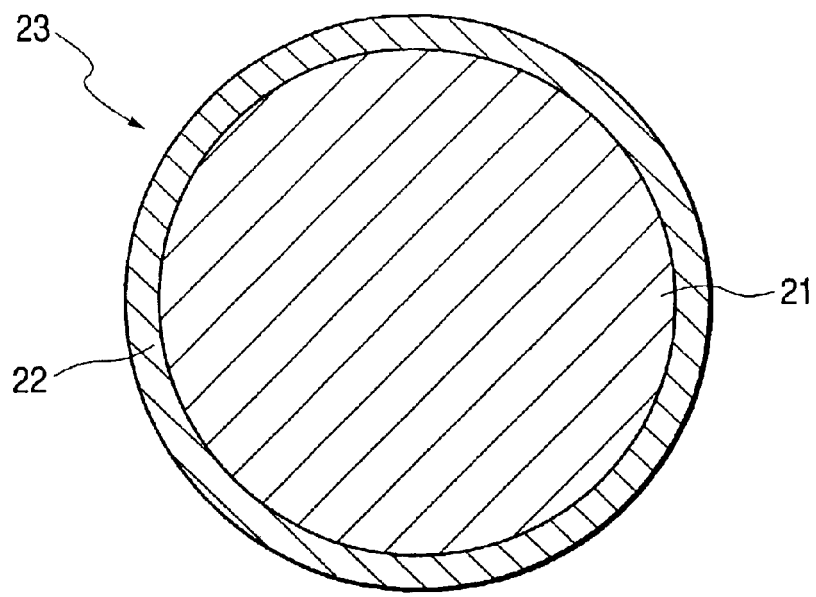
FIG. 4 is a schematic sectional view of each of conductive particles that constitute a conductive material that is used in the printed wiring board of FIG. 1.

As shown in FIG. 1, part of the surface 1e of the contact portion 1a of the flexible insulative board 1 is provided with a plurality of contact patterns (hereinafter referred to as "fixed contact units") 4 of the conductor pattern P at prescribed positions corresponding to the respective push buttons. The fixed contact units 4 are made of a conductive material in which conductive particles 23 in each of which an Au coating layer 22 is formed on the surface of an Ni core particle 21 as a conductive particle (see FIG. 4) are dispersed in thermosetting resin (first binder resin) such as phenol resin or epoxy resin. Each fixed contact unit 4 is composed of an annular first fixed contact 4a and a generally circular second fixed contact 4b that is formed inside the first fixed contact 4a and is not in contact with the first fixed contact 4a.

The conductive particles 23 are formed by electroless plating. Specifically, base Ni particles 21 are immersed in electroless plating liquid and an Au coating layer 22 is formed on each Ni core particle 21 by displacement plating in which chemical substitution between the metal elements and reduction occur.

One first through-hole 2 is formed inside the first fixed contact 4a. The second fixed contact 4b is provided inside the first fixed contact 4a so as to cover part of the first through hole 2, and hence is in contact with the silver paste that fills the first through-hole 2.

Wiring patterns 5 of the conductor pattern P are made of a conductive material in which Ag particles are dispersed in polyester resin (second binder resin). The wiring patterns 5 consist of first wiring lines 5a that are in electrical contact with the first fixed contacts 4a and second wiring lines 5b that are in electrical contact with the second fixed contacts 4b.

As shown in FIG. 1, the first wiring lines 5a are formed on the surface 1e of the flexible insulative board 1. In the contact portion 1a of the flexible insulative board 1, the first wiring lines 5a (excluding one wiring line 5a) connect the first fixed contacts 4a and the one of the first wiring lines 5a extends to the lead portion 1b of the flexible insulative board 1.

As shown in FIGS. 1 and 2, the second wiring lines 5b are formed on both of the surfaces 1e and if of the flexible insulative board 1. As shown in FIG. 2, a plurality of (the same number as the number of fixed contact units 4) second wiring lines 5b are formed on the surface 1f of the flexible insulative board 1. In the contact portion 1a of the flexible insulative board 1, one end portion of each second wiring line 5b is in contact with the silver paste that fills the associated first through-hole 2 and is thereby in electrical contact with the associated second fixed contact 4b via the silver paste. The second wiring lines 5b that are formed on the surface if of the flexible insulative board 1 extend to the lead portion 1b of the flexible insulative board 1, and the other end of each second wiring line 5b is in contact with the silver paste that fills the associated second through-hole 3.

As shown in FIG. 1, a plurality of (the same number as the number of fixed contact units 4) second wiring lines 5b are formed on the surface 1e of the flexible insulative board 1. Each second wiring line 5b formed on the surface 1e in the lead portion 1b of the flexible insulative board 1 is in contact with the silver paste that fills the associated second through-hole 3, and is thereby in electrical contact with the associated second fixed contact 4b via the silver paste and the associated second wiring line 5b formed on the surface 1f of the flexible insulative board 1.

In the lead portion 1b of the flexible insulative board. 1, the wiring patterns 5 extend toward the insertion portion 1c as the end portion of the flexible insulative board 1. The wiring patterns 5 are narrowed toward the insertion portion 1c, and their end portions are arranged parallel with each other in the narrowing portion 1d of the lead portion 1b.

Connection terminals 6 of the conductor pattern P is made of a conductive material in which conductive particles 23 (the same as those mentioned above) are dispersed in thermosetting resin (first binder resin) such as phenol resin or epoxy resin that is harder than the polyester resin (second binder resin) of the wiring patterns 5. As shown in FIG. 1, the connection terminals 6 are connected to the end portions of the wiring patterns 5, respectively, in the narrowing portion 1d of the flexible insulative board 1. In the insertion portion 1c of the flexible insulative board 1, each connection terminal 6 assumes a generally rectangular shape that is wider than the end portion of each wiring pattern 5 and the connection terminals 6 are arranged parallel with each other at small intervals (about 0.5 mm) so as to go in the width W of the insertion portion 1c.

A resist film 7 as a protective film of the wiring patterns 5 of the conductor pattern P is made of an insulative material such as poly(vinyl chloride). As shown in. FIGS. 1 and 2, the resist film 7 is formed on the surfaces 1e and 1f of the flexible insulative board 1 so as to cover the wiring patterns 5. On the surface 1e of the flexible insulative board 1, the resist film 7 is formed with circular windows 7a at the fixed contact units 4 so as to expose the fixed contact units 4 there. The resist film 7 is not formed in a tip portion of the insertion portion 1c so as to expose the connection terminals 6 there (see FIG. 3).

Next, a description will be made of a manufacturing method of the printed wiring board according to this embodiment, particularly a method for forming the conductor pattern P.

A step of forming the fixed contact units 4 of the conductor pattern P and a step of forming the connection terminals 6 of the conductor pattern P are executed simultaneously. Patterns of conductive ink in which conductive particles 23 (described above) are dispersed in organic solvent containing phenol resin (or epoxy resin) are formed on the flexible insulative board 1 by screen printing. Then, the conductive ink is dried to volatilize the organic solvent.

A step of forming the wiring patterns 5 of the conductor pattern P is as follows. The first through-holes 2 and the second through-holes 3 are filled with silver paste by screen printing and the silver paste is dried. Then, patterns of conductive ink in which Ag particles are dispersed in organic solvent containing polyester resin are formed on the flexible insulative board 1 by screen printing. Subsequently, the conductor ink is dried to volatilize the organic solvent.

Either of the combination of the steps of forming the fixed contact units 4 and the connection terminals 6, respectively, and the step of forming the wiring patterns 5 may be executed first. That is, the order may be such that the steps of forming the fixed contact units 4 and the connection terminals 6, respectively, are executed first and the step of forming the wiring patterns 5 is executed later. The opposite order is also possible in which the step of forming the wiring patterns 5 is executed first and the steps of forming the fixed contact units 4 and the connection terminals 6, respectively, are executed later.

After the conductor pattern P is formed in the above-described manner, the resist film 7 is formed on the flexible insulative board 1 by screen printing, whereby the printed wiring board according to the embodiment is completed.

Figure 3:
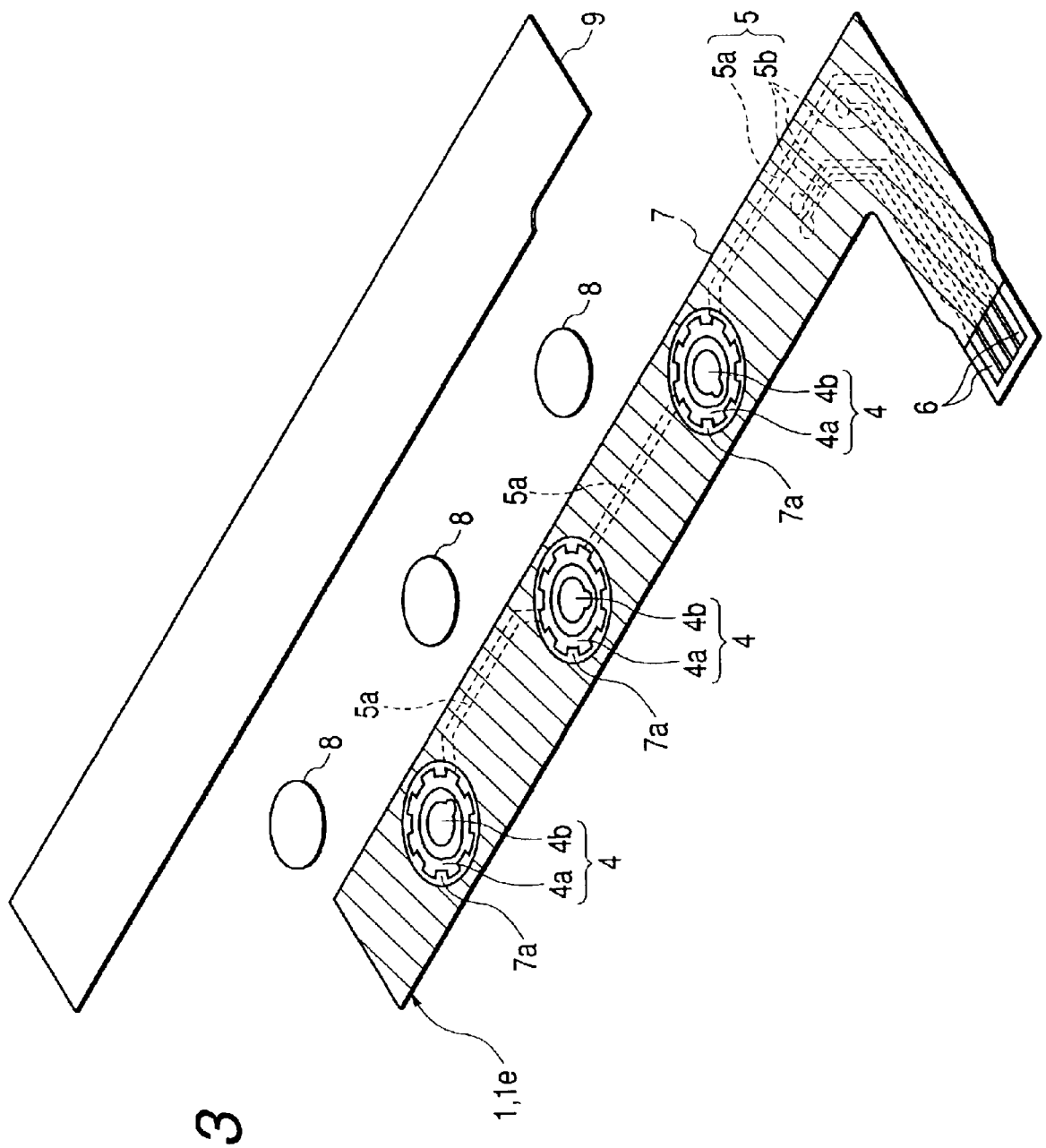
FIG. 3 is an exploded perspective view illustrating an assembling method of a board with switches that uses the printed wiring board of FIG. 1.

Next, a description will be made of an assembling method of a board with switches that uses the printed wiring board according to the embodiment. As shown in FIG. 3, conical movable contacts 8 that are metal-plate springs and have respective openings on the flexible insulative board 1 side are placed on the respective first fixed contacts 4a. Then, a holding sheet 9 made of polyester film is bonded to the surface 1e of the flexible insulative board 1 in such a manner as to cover the movable contacts 8, whereby the movable contacts 8 are fixed to the flexible insulative board 1. In FIG. 3, the surface of the flexible insulative board 1 that is covered with the resist film 7 is hatched.

The board with switches thus assembled is incorporated into an electronic apparatus in the following manner. The insertion portion 1c as the end portion of the flexible insulative board 1 is inserted into the insertion mouth of a connector member (not shown) that is incorporated in the electronic apparatus, whereby the connection terminals 6 of the conductor pattern P are brought into contact with conductor portions (terminals) that are provided inside the insertion mouth. As a result, the conductor pattern P comes into electrical contact with the conductor portions of the connector member. At this time, even if the connection terminals 6 are pressed against the conductor portions of the connector member, the connection terminals 6 are hardly scraped or deformed because the connection terminals 6 which are made of phenol resin or epoxy resin are hard. The connection terminals 6 are not deformed even if the electronic apparatus is put in a high-temperature atmosphere, because phenol resin and epoxy resin are thermoset.

When the printed wiring board according to the embodiment is incorporated into an electronic apparatus, the lead portion 1b of the flexible insulative board 1 is deformed (bent) as appropriate. At this time, since polyester resin as the material of the wiring patterns 5 is soft, the wiring patterns 5 can be deformed together with the flexible insulative board 1, that is, they do not impair the flexibility of the printed wiring board. Since the material (polyester resin) of the wiring patterns 5 is the same as that of the flexible insulative board 1, the wiring patterns 5 are not easily peeled off the flexible insulative board 1.

In an electronic apparatus incorporating the printed wiring board according to the embodiment, the above-mentioned push buttons and the printed wiring board that is mounted with the movable contacts 8 constitute a push-button switch device. The connection terminals 6 are connected to circuits of the electronic apparatus via the conductor portions of the connector member. A voltage is applied between the first fixed contact 4a and the second fixed contact 4b of each fixed contact unit 4 during driving.

In this state, if a push button of the operating panel of the electronic apparatus is manipulated and the associated movable contact 8 is pushed by the push button, the movable contact 8 is deformed against its resiliency and thereby comes into contact with the associated second fixed contact 4b. At this time, the first fixed contact 4a and the second fixed contact 4b contact each other electrically via the movable contact 8. The fixed contact unit 4 is turned on and a current flows through the related part of the conductor pattern P. The current flowing through the part of the conductor pattern P is output as an on signal via the associated connection terminal 6 and the associated conductor portion of the connector member. The main parts of the route of the current flowing through the part of the conductor pattern P are related wiring patterns 5 that extend from the fixed contact unit 4 to the connection terminal 6. Since the wiring patterns 5 have high conductivity because of the Ag particles that are superior conductors, power consumption and heat generation that are caused by the current flowing through the part of the conductor pattern P can be suppressed.

Although in the above embodiment the fixed contact units 4 and the connection terminals 6 of the conductor pattern P are made of the same conductive material, the fixed contact units 4 may be made of the same conductive material as the wiring patterns 5 are. In this case, the method for forming the conductor pattern P should include a step of forming the fixed contact units 4 and the wiring patterns 5 simultaneously and a step of forming the connection terminals 6. In this case, to prevent a migration phenomenon due to silver that is contained in the fixed contact units 4, conductive coatings made of a carbon material or the like may be provided so as to cover the respective fixed contact units 4.

In the above embodiment, the conductive material of the wiring patterns 5 consists of Ag particles and a polyester resin. However, the conductive material may contain carbon or the like as long as it does not impair the high conductivity of the conductive material that is given by the Ag particles.

In the above embodiment, the conductive material of the connection terminals 6 consists of conductive particles 23 and a phenol resin or an epoxy resin. However, the conductive material may contain carbon or the like as long as it does not impair the high conductivity and the anti-migration characteristic of the conductive material that are given by the conductive particles 23.

Figure 5:
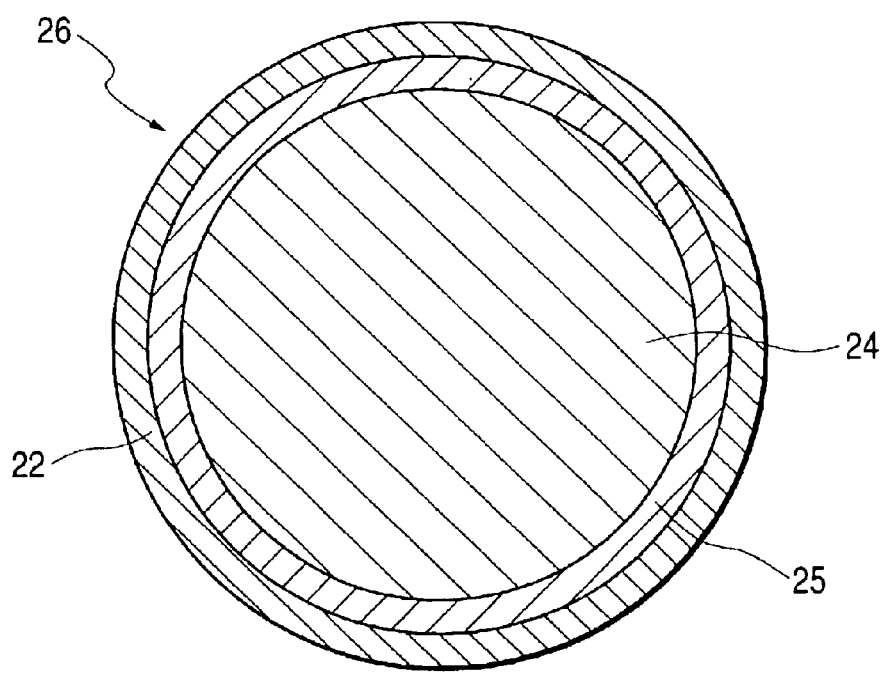
FIG. 5 is a schematic sectional view of each of conductive particles according to another embodiment that constitute the conductive material.

In the above embodiment, conductive particles 23 are dispersed in phenol resin or epoxy resin. However, conductive particles 26, rather than the conductive particles 23, may be dispersed in phenol resin or epoxy resin. As shown in FIG. 5, each conductive particle 26 is formed in such a manner that an Ni coating layer 25 is formed on the surface of a conductive core particle 24 that is not an Ni particle 21 and an Au coating layer 22 is formed on the Ni coating layer 25. In this case, if Cu particles are used as the conductive core particles 24 that are not Ni particles, the resistance of the connection terminals 6 can be kept small because of relatively low resistivity of the Cu particles.

The conductive particles 26 are formed by electroless plating. Specifically, base conductive particles 24 are immersed in electroless plating liquid and an Ni coating layer 25 and an Au coating layer 22 is formed in order on each conductive core particle 24 by displacement plating in which chemical substitution between the metal elements and reduction occur.

Figure 6:
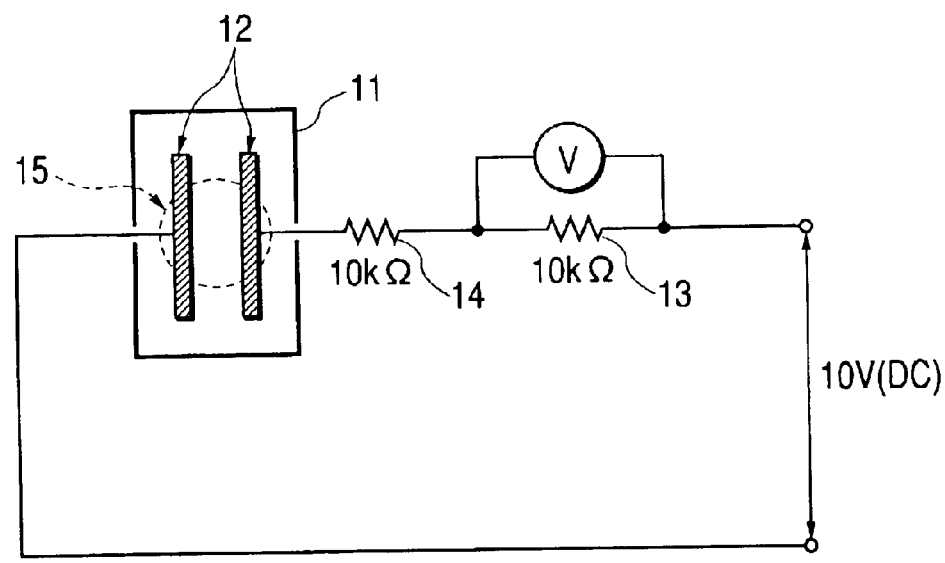
FIG. 6 shows an instrument for measuring the anti-migration characteristic of a conductive material.
Figure 7:
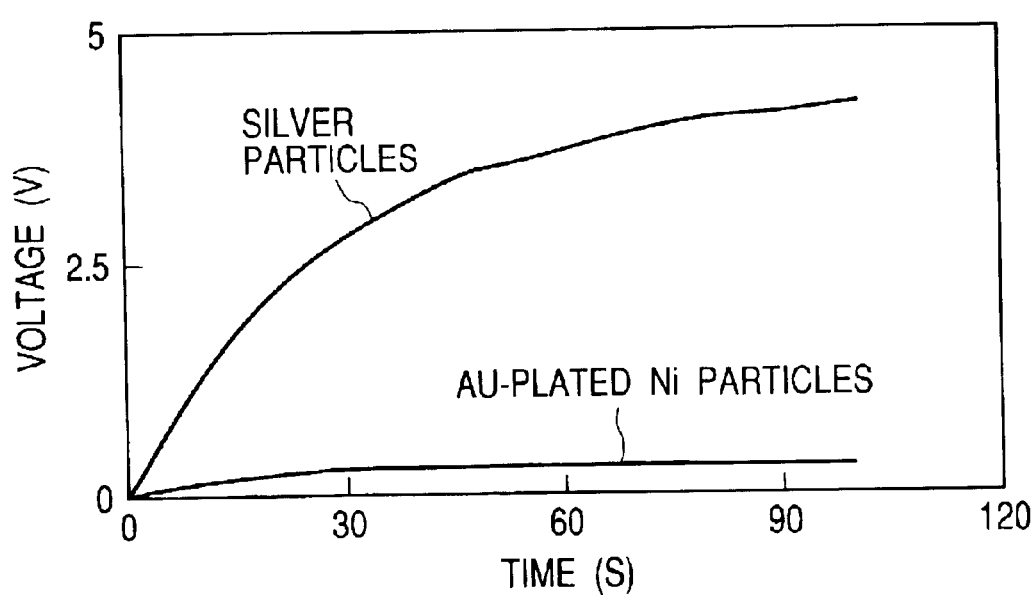
FIG. 7 is a graph showing an anti-migration characteristic of the conductive material of the connection terminals of the printed wiring board according to the first embodiment.
Figure 8:
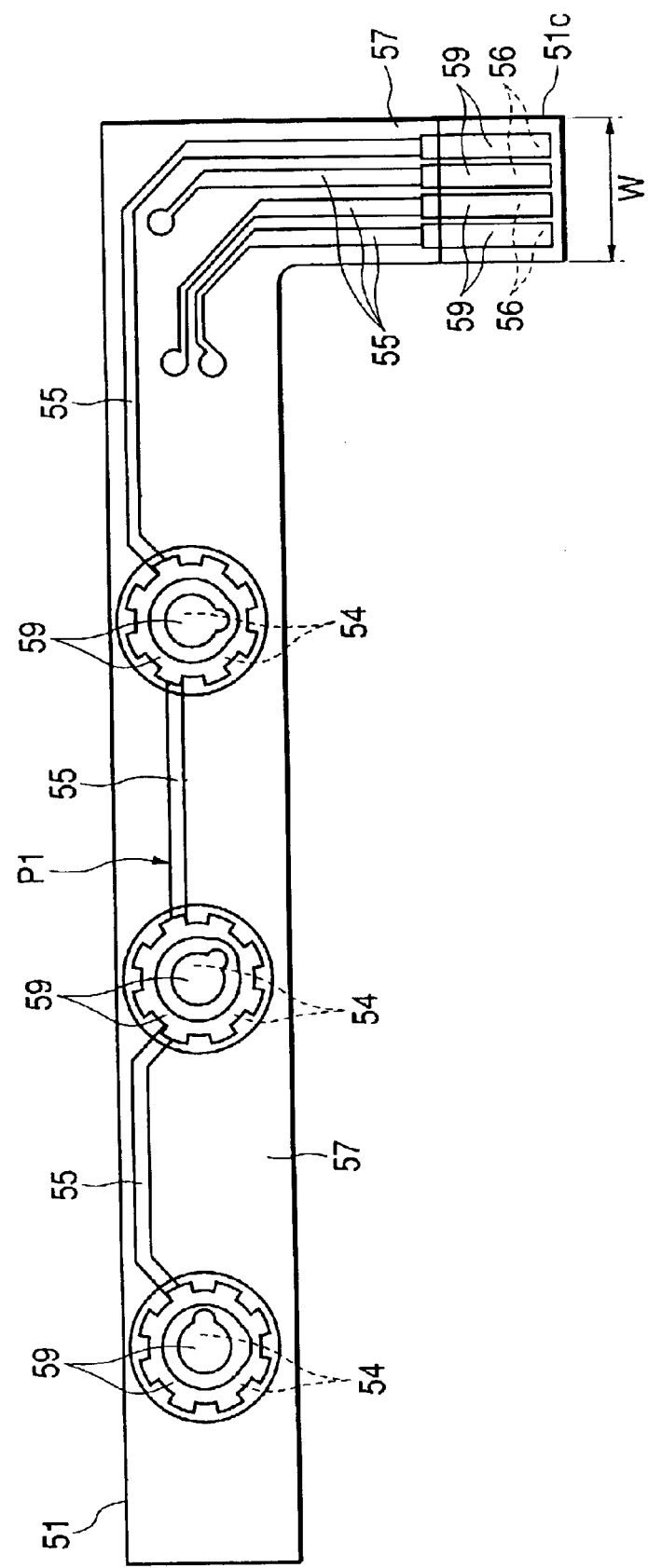
FIG. 8 is a plan view of a conventional printed wiring board.

Next, a description will be made of the anti-migration characteristic of the conductive materials of the connection terminals 6 according to the above embodiments. Anti-migration characteristics were measured by using an instrument shown in FIG. 6.

Two band-shaped patterns 12 (2 mm wide by 40 mm long) made of a conductive material are formed parallel with each other with an interval of 1 mm on a board 11 that is made of an insulative material. A series connection of a first resistor 13 and a second resistor 14 each being 10 kΩ is connected to one of the two band-shaped patterns 12. A voltage across the first resistor 13 was measured by applying a DC voltage 10 V between the two band-shaped patterns 12 via the first resistor 13 and the second resistor 14 in a state that the two band-shaped patterns 12 are covered with distilled water 15.

FIG. 5 is a graph showing how the measured voltage across the first resistor 13 varies with time. If the area between the two band-shaped patterns 12 made of a conductive material is rendered conductive due to a migration phenomenon, a current flows through the first resistor 13 to increase the measured voltage across the first resistor 13.

When the two band-shaped patterns 12 were made of a conductive material in which conductive particles 23 that were the same as used in the connection terminals 6 were dispersed in phenol resin, almost no increase was found in the measured voltage. On the other hand, when the two band-shaped patterns 12 were made of a conductive material in which Ag particles were dispersed in phenol resin, the voltage increased rapidly with time. These results show that the conductive particle 23 is superior in anti-migration-characteristic than the Ag particle.

Almost no increase was found in the measured voltage also when the two band-shaped patterns 12 were made of a conductive material in which conductive particles 23 were dispersed in epoxy resin or a conductive material in which conductive particles 26 were dispersed in phenol resin or epoxy resin.

In the printed wiring board according to the invention, the wiring patterns 5 are made of the conductive material containing Ag particles and the connection terminals 6 that are arranged parallel with each other and connected to the ends of part of the wiring patterns 5, respectively, are made of the conductive material containing conductive particles 23 or 26.

In this printed wiring board, the connection terminals 6 and the wiring patterns 5 are made of different conductive materials, whereby the narrow insertion portion 1c on which the connection terminals 6 having a superior anti-migration characteristic are arranged parallel with each other at small intervals without being covered with respective conductive coatings can be inserted into a narrow insertion mouth of a small connector member while high conductivity of the wiring patterns 5 that is given by Ag particles is maintained.

What is claimed is:

1. A printed wiring board comprising:

an insulative board;

a plurality of wiring patterns formed on the insulative board; and a plurality of connection terminals that are arranged parallel with each other on the insulative board and are connected to at least part of the wiring patterns, respectively, wherein the connection terminals are made of a conductive material in which conductive particles having a gold coating layer formed on a surface of a conductive core particle are dispersed in a first binder resin; and, wherein the wiring patterns are made of, a conductive material in which silver particles are dispersed in a second binder resin;

wherein the wiring patterns and the conductive terminals are separately formed on the insulative board.

2. The printed wiring board according to claim 1, wherein the conductive core particle is a nickel particle.

3. The printed wiring board according to claim 1, wherein a nickel coating layer is interposed between a surface of the conductive core particle and the gold coating layer.

4. The printed wiring board according to claim 1, wherein the insulative board is flexible.

5. The printed wiring board according to claim 4, wherein the connection terminals are harder than the wiring patterns.

6. The printed wiring board according to claim 5, wherein the first bind resin is a thermosetting resin.

7. The printed wiring board according to claim 6, wherein the insulative board is made of polyester resin film, the first binder resin is one of a phenol resin and an epoxy resin, and the second binder resin is a polyester resin.

8. The printed wiring board according to claim 1, further comprising patterns that are formed on the insulative board and are electrically connected to the wiring patterns, the contact patterns being made of the same material as the connection terminals or the wiring patterns.

9. The printed wiring board according to claim 1, wherein the wiring patterns are covered with a protective film made of an insulative material.

10. The printed wiring board according to claim 1, wherein each connection terminal is wider than the end portion of each wiring pattern.

11. The printed wiring board according to claim 1, wherein the plurality of connection terminals are connected to at least end portions of the wiring patterns.

* * * * *

UNITED STATES PATENT AND TRADEMARK OFFICE
CERTIFICATE OF CORRECTION

PATENT NO. : 6,940,024 B2
DATED : September 6, 2005
INVENTOR(S) : Yasushi Watanabe It is certified that error appears in the above-identified patent and that said Letters Patent is hereby corrected as shown below:

Column 10,
Line 28, after "formed on" insert -- the surface of --.
Line 39, after "the first" delete "bind" and substitute -- binder --.

Signed and Sealed this

Fourth Day of April, 2006

JON W. DUDAS
*Director of the United States Patent and Trademark Office*